(12) United States Patent
Smith

(10) Patent No.: US 6,322,935 B1
(45) Date of Patent: Nov. 27, 2001

(54) METHOD AND APPARATUS FOR REPAIRING AN ALTERNATING PHASE SHIFT MASK

(75) Inventor: Eryn Smith, San Ramon, CA (US)

(73) Assignee: Metron Technology, Sunnyvale, CA (US)

(*) Notice: Subject to any disclaimer, the term of this patent is extended or adjusted under 35 U.S.C. 154(b) by 0 days.

(21) Appl. No.: 09/514,823

(22) Filed: Feb. 28, 2000

(51) Int. Cl.[7] ............................ G03F 9/00; G01N 23/00; G21K 7/00
(52) U.S. Cl. ........................................... 430/5; 250/307
(58) Field of Search ........................... 430/5, 322, 30; 382/144, 141; 250/492.2, 492.22, 492.3, 306, 307, 309, 310, 311; 716/21

(56) References Cited

U.S. PATENT DOCUMENTS 5,517,027 * 5/1996 Nakagawa et al. ............... 250/306
5,569,392 * 10/1996 Miyoshi et al. ..................... 216/60
5,965,301   10/1999 Nara, et al. .
5,994,001   11/1999 Nakao .

\* cited by examiner

*Primary Examiner*—S. Rosasco
(74) *Attorney, Agent, or Firm*—Steven R. Caserza; Flehr Hohbach Test Albritton & Herbert LLP

(57) ABSTRACT

A method and apparatus for correcting phase shift defects in a photomask is provided by scanning the photomask for the defect and determining locations of at least one defect. Following the determination of the location of a defect, the defect is three-dimensionally analyzed producing three-dimensional results. Utilizing the three-dimensional results, a focus ion beam (FIB) is directed onto the defect to eliminate the defect. The FIB is controlled by an etch map which is generated based on the three-dimensional results. To provide further precision to the repairing of the photomask, test patterns of the FIB are generated and three-dimensionally analyzed. The three-dimensional test pattern results are further utilized in generating the etch map to provide greater control to the FIB.

21 Claims, 9 Drawing Sheets

METHOD AND APPARATUS FOR REPAIRING AN ALTERNATING PHASE SHIFT MASK

FIELD OF THE INVENTION

The present invention relates generally to a method for correcting defects formed on a photomask, more specifically, to a method for correcting defects formed on a alternating phase shift photomask.

BACKGROUND OF THE INVENTION

The attempt to increase integration density of semiconductor circuits has resulted in the significant size reduction of patterns used to form the semiconductor circuits. Photomasks are utilized by the semiconductor circuit industry to produce the minute patterns onto semiconductor materials or wafers through photolithographic processing during the manufacturing of these integrated semiconductor circuits.

FIG. 1 depicts a sectional view of a portion of a standard photomask 52. Referring to FIG. 1, a typical mask has a metal light shielding film or layer 54 of a prescribed pattern formed on a mask substrate 56. When the metal light shielding film 54 is formed through known techniques an opaque defect (excess metal film) 72 may be generated. FIGS. 2–4 illustrate one example the generation of an opaque defect 72 on a mask 52 in the manufacturing process of a standard mask 52. FIG. 2 depicts one of the initial stages in the generation of a mask 52. A layer of light shielding film 54 is disposed over the entire surface of mask substrate 56. Mask substrate is normally formed of a transparent silica, quartz or other material well known in the art. Light shielding film 54 is typically formed of elements and compounds consisting of Cr, Mo, F, Si, Zr, O, N. A layer of photo sensitive polymer resist 58 is deposited over the entire surface of layer of light shielding film 54. After resist 58 is coated over the metal light shielding layer 54, a prescribed portion of resist 58 is exposed to a radiation source 64. If foreign material 66 is present in or on resist 58 at the time of exposure, in a region of mask 52 to be exposed, the portion of resist positioned under foreign material 66 will not be exposed resulting in a mask defect. Referring to FIG. 3, if the region to be originally exposed is thus not exposed due to foreign material 66, unnecessary resist artifacts 68 are formed when resist 58 is developed. Referring to FIG. 4, when unnecessary resist artifact 68 is formed, and the metal light shielding film 54 is subjected to etching, utilizing resist 58 as an etching pattern, a metal light shielding film opaque defect 72 is formed. Alternatively, due to incorrect exposure or an error in the design pattern, other areas of resist 58 also may not be exposed resulting in similar defects in mask 52. FIG. 5 depicts a standard method to correct opaque defects 72 in metal light shielding film 54 utilizing an Nd:YAG laser beam or alternatively a focus ion beam (FIB) 74. FIB 74 is irradiated onto opaque defect 72. Thus, opaque defect 72 is evaporated or sputtered and removed, as shown in FIG. 6. An Nd:YAG laser beam typically used has a wavelength of about ~532 nm and irradiated for about 200 mJ–300mJ, while a typical FIB 74 uses a dose of approximately 400–600 µJ.

The prior art methods for correcting the opaque defect 72 of metal light shielding material provides satisfactory results in correcting opaque defects 72 in standard masks. However, when using a laser to remove the metal light shielding material, the metal light shielding material is not removed, but displaced or redeposited in the surrounding areas causing material swelling in the mask. Additionally, the laser spot size is large, thus, limiting the ability to repair highly integrated patterns. Further, the use of lasers tends to remove a portion of the substrate under the defect depending on the defect size. Because of the heat required to ablate the opaque defect 72 of light shielding material, the underlying substrate 56 is usually partially ablated or melted through thermal conduction, thus, reducing the effectiveness and precision of mask 52.

The effectiveness of an FIB 74 in the removal of opaque defect 72 is, to a large extent, based on the fact that a contrast distinction exists between the defect 72 and the transmitting window 78. Because FIB devices utilize secondary charged particles for imaging (i.e. secondary electrons or ions), a contrast between the defect and the correctly etched areas must be present to properly determine the size of the defect and the amount of light shielding material to be removed. With a standard mask 52, the contrast is large, the defect consists of a metal light shielding material while the correctly etched area is a transparent material. Thus, an FIB device can determine the size and amount of correction. However, without a significant contrast, an FIB device would not be able to accurately determine the defect size nor the degree of correction needed to accurately correct the defect or to avoid further damage to the surrounding mask.

The need to increase integration density has forced the positioning of the light transmitting windows or regions 76a and 76b closer together, as shown in FIG. 7. However, light transmitted through transmitting windows 76 will overlap if transmitting windows are positioned to close together. The light intensity 78 of the light transmitted through transmitting windows 76a and 76b is shown in FIG. 8. Light intensity 78a transmitted through window 76a will overlap light intensity 78b transmitted through window 76b. Thus, a total light intensity 80 results producing an in inaccurate integrated circuit.

In order to achieve further increased integration density a photomasking technique has been developed which provides for an alternating phase shift in the light which is projected through the mask. This type of photomasking is known as alternating phase shift photomasking or Levenson phase shift masking.

FIG. 9 depicts a sectional view of a portion of an alternating phase shift photomask or Levenson phase shift mask 120. Phase shift mask 120 includes a transparent silica substrate 122, including a phase shift region or layer 124 formed in substrate 122, and a radiation shielding film 126. For simplicity, this specification assumes the radiation used to form an integrated circuit pattern is light, although other types of radiation are also suitable. When radiation, for example from a light source, is shown or exposed onto mask 120, light passes through the regions of mask 120 which are not covered by light shielding film 126. The light which passes through mask 120 will be affected by the phase shift layer 124. Because of differing heights of phase shift layer 124, the light passing through it will exit mask 120 with different phases. The transparent regions or phase shift areas 130a and 130b are specifically arranged in an alternating pattern such that a first phase shift layer thickness (for example at 130a) is positioned next to a second phase shift layer thickness (130b) such that light passing through transparent regions 130a and 130b will exit at alternating phases thus producing a cancelling effect. The height differences of the phase shift layer 124 are specifically calculated according to the exposure lambda ($\lambda$) and index of refraction (n) of the substrate step depth (d), defined by: $d=\Phi/\pi\lambda/(n-1)$.

In FIG. 10, the electric field of the transmitted light passing through mask 120 is shown. The light transmitted through region 130a of mask 120 produces a negative electric field 142 due to the lack of phase shift layer 124. The light transmitted through region 130b of mask 120, and thus phase shift layer 124, results in a positive electric field 144 and is thus 180° out of phase with the light transmitted through region 130a.

Due to the placement of the alternating transparent regions, the light transmitting through transparent regions 130a and 130b will produce a cancelling or destructive interference on those regions between the transparent regions 130a and 130b. Thus the exposure resolution and depth is greatly improved. FIG. 11 depicts the resulting transmitted light intensity of the light being transmitted through mask 120. Because of the cancelling effects of the alternate phases, the light intensity is ideally at a zero level 148 between transparent regions 130a and 130b, and at a maximum positive level 150a and 150b at the transparent regions 130a and 130b.

When the substrate etching process to form a phase shift photomask is performed, any foreign material in the photo resist or on the substrate will produce a defect in the mask. The foreign material will interfere with the etching process thus producing an unetched bump or incomplete etching in phase shift layer 124. These defects are three-dimensional in nature. Use of a laser beam cannot remove the phase shift defect, because the phase shift defect is formed of a transparent material like $SiO_2$, and a laser beam will transmit directly through the phase shift defect, thus having no effect on the phase shift defect. Further, a laser would not provide the accuracy needed because the laser spot size is so large in comparison to the size of both the mask details and defects.

Defects within a mask make the mask virtually useless, thus drastically increasing the costs to manufacture integrated circuits. Due to the extreme accuracy needed in the manufacture of Levenson phase shift masks and the size of the defects created, simply directing an FIB onto a phase shift defect cannot accurately correct the defects. Because the defect and the substrate are the same material, there is no contrast to distinguish the defect from the substrate. Thus, the FIB cannot accurately determine the size of the defect nor the amount of correction needed. Further, because the FIB device cannot determine size, location and amount of correction needed, the FIB can cause extensive damage to the substrate or surrounding phase shift material. Therefore, an effective and accurate method of correcting phase shift defects is needed.

SUMMARY

A method and apparatus for correcting phase shift defects in a photomask is provided by scanning the photomask for the defect and determining locations of at least one defect. Following the determination of the location of a defect, the defect is three-dimensionally analyzed producing three-dimensional results. Utilizing the three-dimensional results, a focus ion beam (FIB) is directed onto the defect to eliminate the defect. The FIB is controlled by an etch map which is generated based on the three-dimensional results. To provide further precision to the repairing of the photomask, test patterns of the FIB are generated and three-dimensionally analyzed. The three-dimensional test pattern results are further utilized in generating the etch map to provide greater control to the FIB.

The method and apparatus of the present invention provide for the precise removal of residual phase shift defects. Because the defects are three dimensional, simply directing an FIB at the defect will not accurately remove the defect. By providing a three-dimensional analysis of the defect, the present invention provides for greater precision in correcting the defect and thus produces a much more highly accurate alternating phase shift photomask. Further, by providing for the analysis of test patterns of the beam being utilized to correct the defect, even greater precision is obtained.

DETAILED DESCRIPTION

Figure 1:
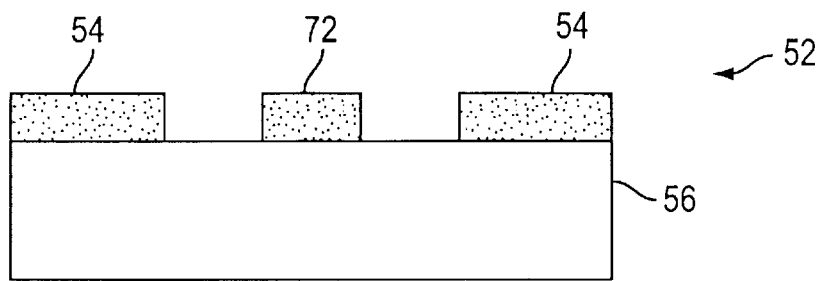
FIG. 1 is a cross-sectional view of a portion of a standard prior art photomask.
Figure 2:
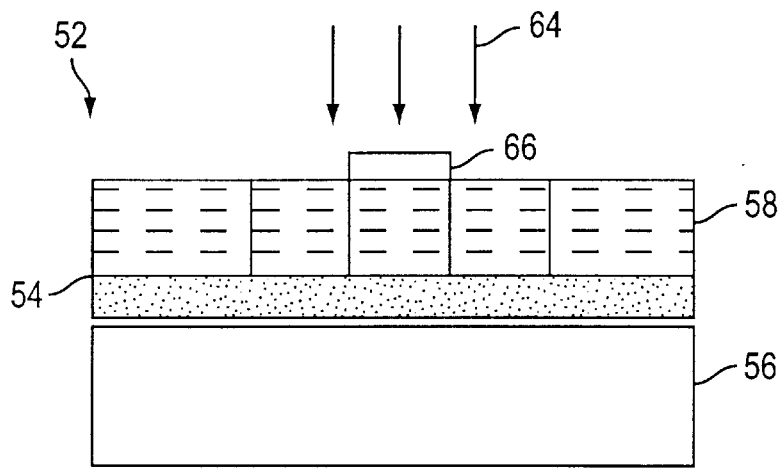
FIG. 2 is a cross-sectional view of a portion of a prior art photomask during one phase of an etching process including photo resist material.
Figure 3:
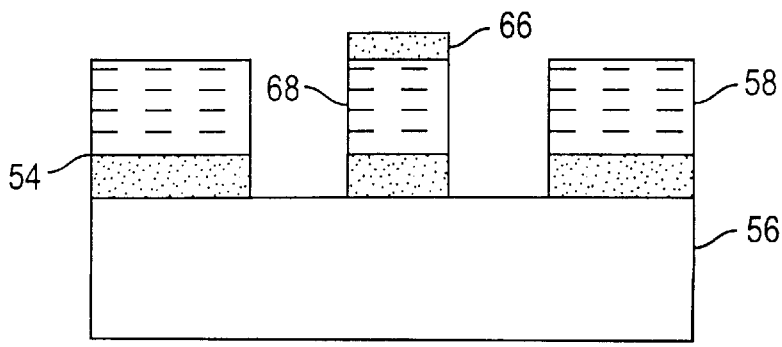
FIG. 3 is a cross-sectional view of the prior art photomask of FIG. 2 after an etching including foreign material and resist artifact.
Figure 4:
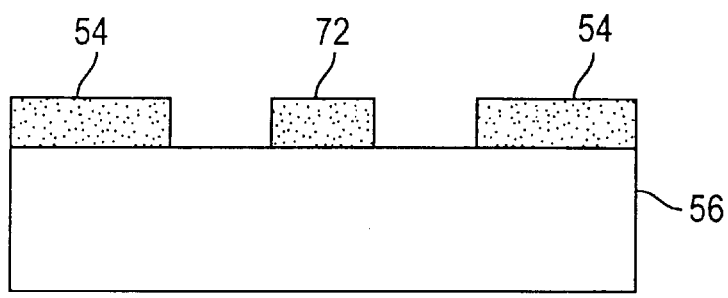
FIG. 4 is a cross-sectional view of the prior art photomask of FIG. 3 after resist material has been removed including opaque defect.
Figure 5:
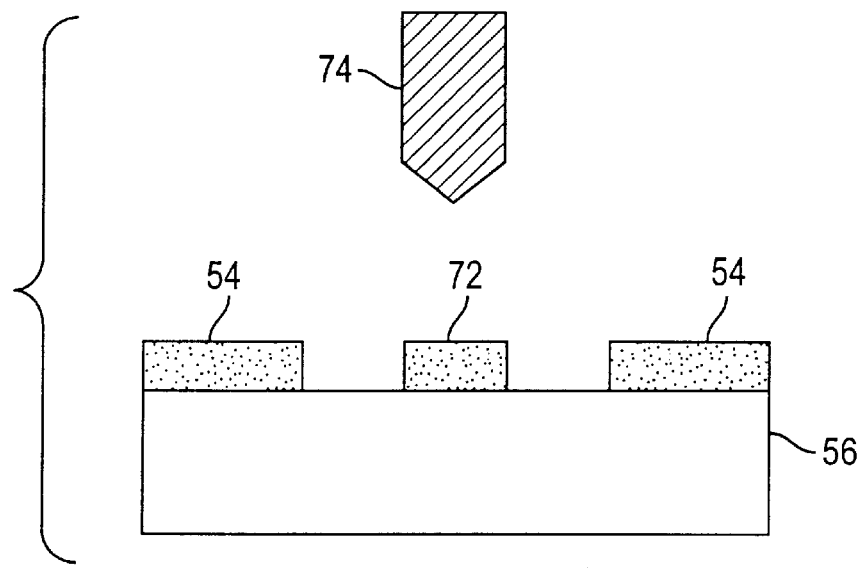
FIG. 5 is a cross-sectional view of the prior art photomask of FIG. 4 including a focus ion beam being directed onto the opaque defect.
Figure 6:
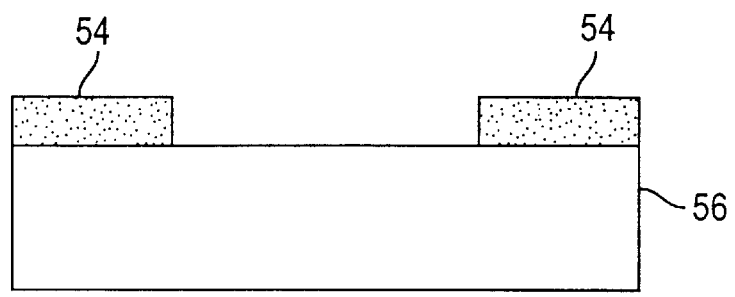
FIG. 6 is a cross-sectional view of the prior art photomask of FIG. 5 after opaque defect has been removed.
Figure 7:
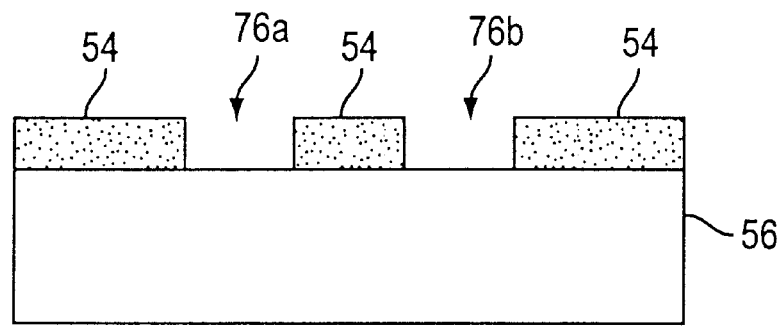
FIG. 7 is a cross-sectional view of a prior art photomask including two, closely spaced, transmitting windows.
Figure 8:
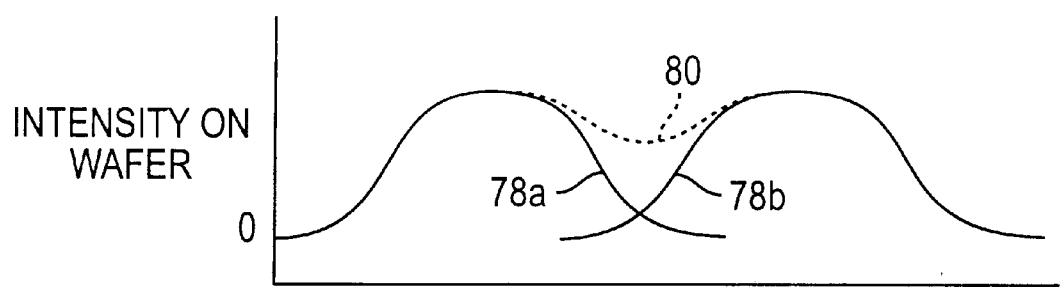
FIG. 8 is a graphical representation of the light intensity transmitted through the prior art. photomask of FIG. 7.
Figure 9:
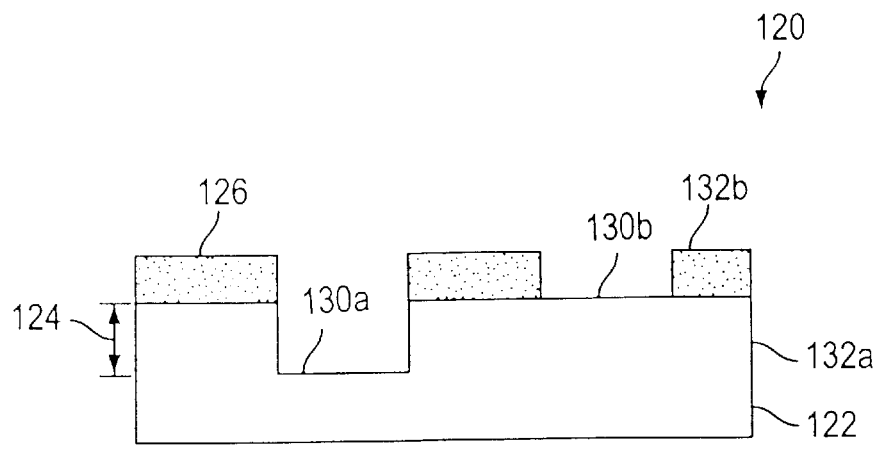
FIG. 9 is a cross-sectional view of a portion of a prior art alternating phase shift photomask including light transmitting or phase shift areas.
Figure 10:
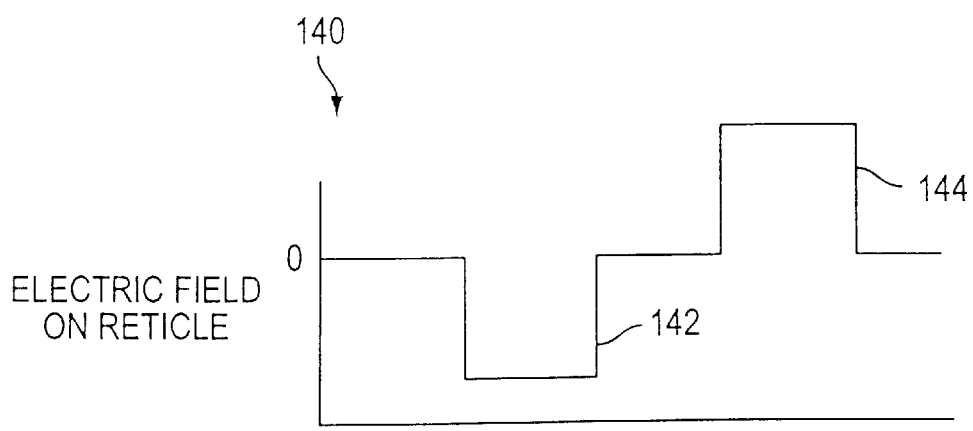
FIG. 10 is a graphical representation of the electric field intensity of light transmitted through phase shift areas of the prior art photomask of FIG. 9.
Figure 11:
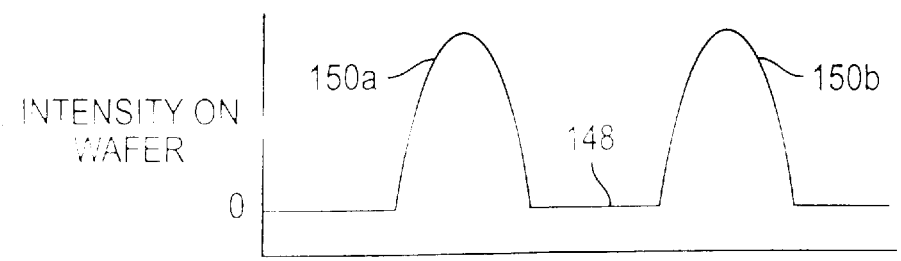
FIG. 11 is a graphical representation of the light intensity transmitted through the prior art phase shift mask of FIG. 9.

The present invention provides a novel method and structure for the correction of errors or defects on Levenson or alternating phase shift masks. FIG. 9 depicts one embodiment of a Levenson phase shift mask 120. Phase shift mask 120 includes a mask substrate 122 formed from any suitable material which is transparent, rigid, thermally stable (low thermal expansion) and durable, including silica, quartz, calcium fluoride ($CaF_2$) and other materials well known in the art. Substrate 122 includes a phase shift region or layer 124 formed in substrate 122 by etching substrate to create phase shift differential step heights 132. A light shielding layer or film 126 is formed over predefined regions of phase shift layer 124 and substrate 122. Light shielding layer 126 is constructed of any suitable material which blocks all or some portion of light or radiation, including metal such as chromium (Cr), metal compounds such as molybdenum silicide (MoSi), chromium fluoride (CrF) and chromium oxide ($Cr_mO_n$, where $m \geq 1$, $n \geq 1$), and other light shielding material as are well known in the art.

Figure 12:
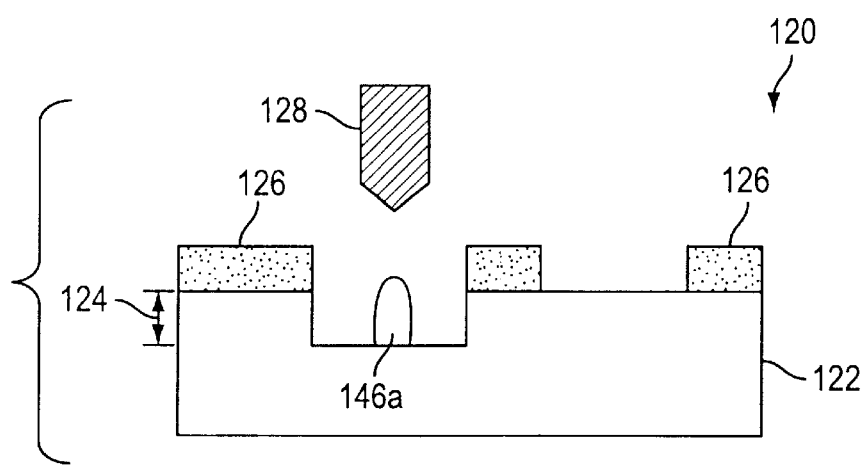
FIG. 12 is a cross-sectional view of a portion of a photomask including a bump defect.
Figure 13:
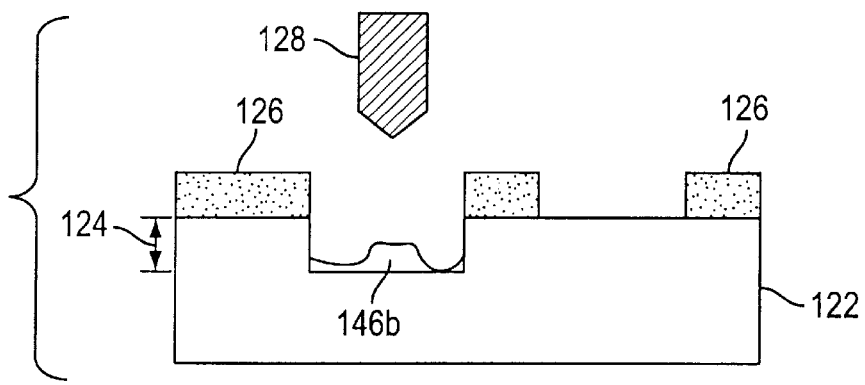
FIG. 13 is a cross-sectional view of a portion of a photomask including an incomplete etching defect.

In forming phase shift mask 120 a predefined pattern is etched into light shielding film 126, for example through well known techniques, thus exposing phase shift layer 124. Phase shift areas 130*a* and 130*b* are then formed by a second etching which creates the phase differential step heights 132*a* and 132*b* in phase shift layer 124 of substrate 122. The second etching is performed by a similar process as the etching of the light shielding film 125. A resist is distributed over mask 120 and a pattern exposed in the regions where a phase shift step height 132*a* is desired. The etching is performed in any convenient manner, including by etching processes well known in the art, for example an anisotropic plasma etching of fluorinated chemistry. The resist is then removed resulting in a mask with phase differential step heights 132. These phase differential heights 132*a* and 132*b* provide for the alternating phase which is produced as light or other form of radiation is exposed onto mask 120 and passes through phase shift areas 130*a* and 130*b*. FIGS. 12 and 13 show two types of phase shift defects 146*a* and 146*b*. Phase shift defects 146*a* and 146*b* formed in the phase shift areas 130*a* and 130*b* severely affect the accuracy of mask 120. Therefore, it is critical to the mask production process that defects 146*a* and 146*b* are found and corrected. When phase shift defects 146*a* and 146*b* are detected it is necessary to remove and planarize the surfaces of defects 146 to ensure an accurate mask.

The novel invention disclosed herein provides for the correction of mask defects which greatly reduces the cost of mask production, provides for increased accuracy in the integrated circuits produced, and provides for an overall reduction in total cost in the production of highly integrated circuits. In one embodiment of the present invention, following the etching of the phase shift masks 120 as is know in the art, mask 120 is then inspected for defects. One device which is used for inspecting mask 120 includes the use of an appearance tester (not shown), manufactured by KLA Instruments Corp. of San Jose, Calif., or other similar devices known in the art can be used. The appearance tester operates by comparing the mask image to the mask design stored in memory within or external to the appearance tester, or by comparing one die to another. During inspection of mask 120, if defects are detected in phase shift layer 124, the exact locations of the defects found by the appearance tester are stored.

Figure 14:
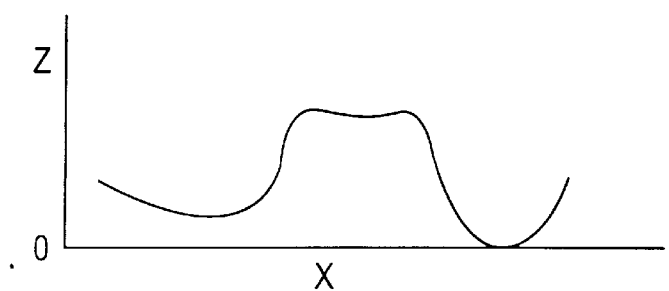
FIG. 14 is a two-dimensional graphical representation of the incomplete etching defect of FIG. 13.

Two examples of etched phase shift defects 146*a* and 146*b* are shown in FIGS. 12 and 13. Referring to FIG. 12, a quartz bump 146*a* is shown which is caused by foreign particles inhibiting proper etching as described in the prior art or unbalanced chemical formulation of the photoresist which causes a residual resist to remain on phase shift layer 124 after development and before etching. The residual resist is then transferred into phase shift layer 124 after the etching of substrate 122. FIG. 13 shows an incomplete quartz etch 146*b* which is caused by an inaccurate exposure, foreign particle or residual resist. FIG. 14 depicts a two-dimensional graphical representation of the incomplete quartz etch defect 146*b* shown in FIG. 13.

Figure 15:
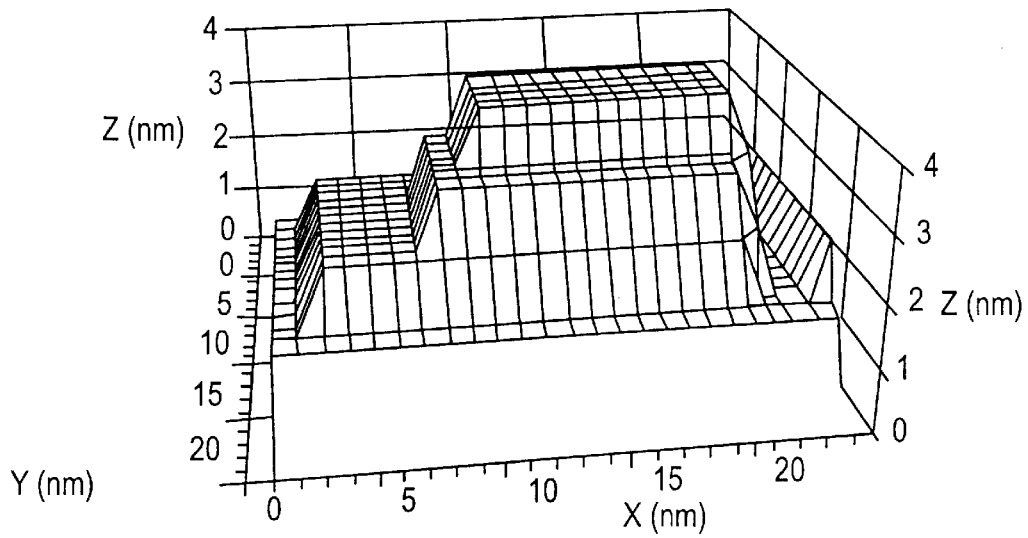
FIG. 15 is a three-dimensional graphical representation of the incomplete etching defect of FIG. 13.

Once phase shift defects 146 are discovered in mask 120, it is important that the size and dimensions of phase shift defects are analyzed to ensure a precise repair is done to produce an accurate mask 120. In one embodiment of the present invention, the analysis of the phase shift defects is performed by positioning mask 120 within an atomic force microscope (AFM), not shown. The AFM is then positioned over a phase shift defect utilizing the location data determined by the appearance tester. The AFM is then activated to precisely scan or measure the size and dimensions of phase shift defect 146. The AFM utilizes the data obtained in the scan to generate a three-dimensional representation of phase shift defect 146. FIG. 15 depicts a three-dimensional graphical representation of incomplete quartz etch 146*b* generated by an AFM. Alternatively, a profilometer, for example a Dektak profilometer produced by Veeco Instruments, Inc. of Plainview, N.Y., a nanoprofilometer produced by Surface Interface, Inc. of Sunnyvale, Calif., or other similar device known in the art, may be implemented to three-dimensionally analyze phase shift defects 146. By obtaining a detailed defect topograph, the present invention does not solely rely on the FIB device to analyze the defect, thus being able to achieve an exact correction of the defect.

Once phase shift defect 146 is accurately and precisely analyzed and measured, mask 120 is then corrected or repaired by removing phase shift defect 146 and planarizing the repaired area. Phase shift defect 146 is removed by directing actinic radiation at phase shift defect to sputter phase shift defect 146. In one embodiment of the present invention the actinic radiation is generated by a focus ion beam (FIB) device. One example of an FIB device which is utilized to implement the present invention is an FIB device which outputs approximately 20–50 kV Gallium (Ga) ions, such as an SMI 9800 or SIR series manufactured by Seiko Instruments Inc. of Chiba-ken, Japan. Alternatively, an FIB device outputting Gold (Au), Silicon (Si), Beryllium (Be), Indium (In), or Zinc (Zn) ions may also be used. The three-dimensional data or results generated by the AFM is forwarded to the FIB device. The FIB device then produces an etch map 156 (shown in FIG. 16) which defines exposure duration, beam scan location and drift correction for precise beam focus locations. Mask 120 is positioned within the FIB device such that an FIB 128 generated by the FIB device is directed at phase shift defect 146 to sputter or evaporate phase shift defect 146 thus producing a repaired and accurate mask 120.

Knowledge of the actinic radiation beam or FIB's etching shape and etching rate enhances the precision of the mask repair. In one embodiment, compensation for actinic radiation beam parameters are included within calculations to generate etch map 156. Other parameters that are used in various embodiments to provide further precision include beam shape and sputter rate. In such embodiments, FIB 128 parameters are taken into account in determining duration and intensity of FIB 128 exposure when FIB 128 is directed at phase shift defect 146, thus compensating for differing beam characteristics and thus ensuring accurate repair of mask 120. Thus, FIB 128 is controlled by both the three-dimensional results obtained from the analysis of defect 146 and the FIB parameters.

Figure 16:
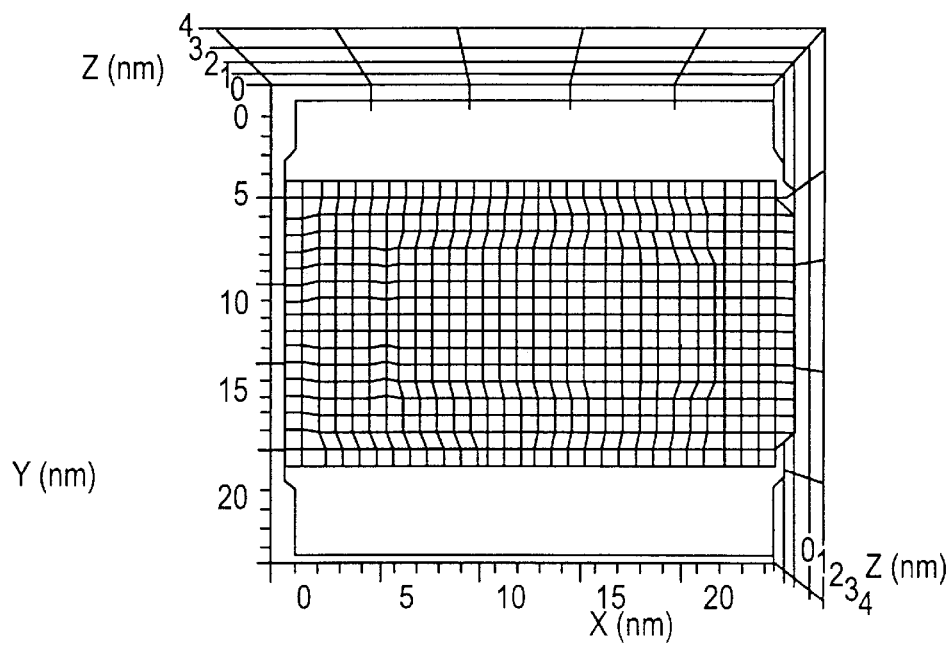
FIG. 16 is a graphical representation of an etch map of the incomplete etching defect of FIG. 13.
Figure 17:
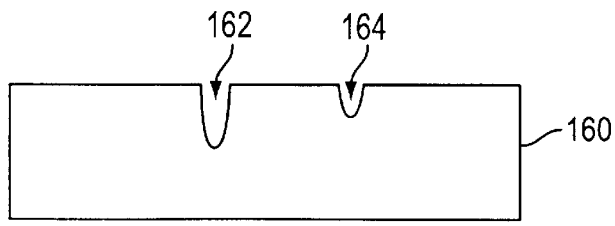
FIG. 17 is a cross-sectional view of a test substrate material including two test patterns.
Figure 18:
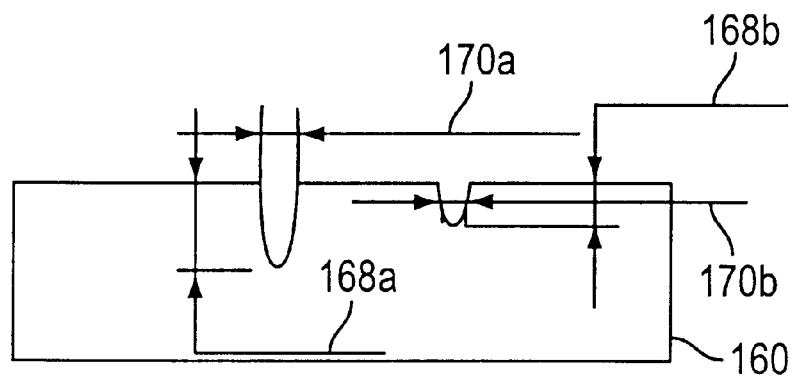
FIG. 18 is a cross-sectional view of the test substrate as shown in FIG. 17 including parameter measurements.

Referring to FIG. 17, in one embodiment an actinic radiation or FIB device is used to sputter or generate predetermined test or measurement patterns 162 and 164 into a test substrate material 160. Test substrate material 160 will consist of the same quartz substrate material used to form the mask phase shift layer 124 (FIG. 9). Referring to FIG. 18, the actinic radiation or FIB test patterns 162 and 164 are then analyzed or measured to determine the FIB beam parameters including etch depth/dose 168a and 168b, beam width/dose 170a and 170b, dose to aspect ratio and dose to pixel width. The parameters are then stored for use in calculating etching map 156 (see FIG. 16). In one embodiment of the present invention an AFM, a profilometer or other device well know in the art is used to three-dimensionally measure the etched test patterns 162 and 164, and produce three-dimensional results. The measured data including the etch depth/dose 168a and 168b and the beam width/dose 170a and 170b are forwarded to the FIB device, via a LAN, RS232C or other mechanism, and stored in an internal memory.

Using internal algorithms the FIB device creates etch map 156 utilizing the three-dimensional data of phase shift defect 146 and FIB beam parameters. FIG. 16 depicts the etch map 156 of phase defect 146b. Etch map 156 is generated to accurately determine and define etch depth per dose area (depth/dose) and etch width/dose to accurately determining and minimizing the scan area according to the beam shape. Thus preventing the beam from scanning an area larger than the actual defect area.

In an alternative embodiment, the appearance tester and the AFM are coupled to a processor and memory. The defect location information and three-dimensional results are forwarded from the appearance tester and AFM to the memory. The processor accesses the memory for the defect location information to control the AFM and FIB positioning. Further, the processor generates or calculates etch map 156 from the defect location information and the three-dimensional results. The etch map 156 is forwarded from the processor to the FIB device. Alternatively, the processor utilizes the etch map 156 to provide control to the FIB device.

Figure 19:
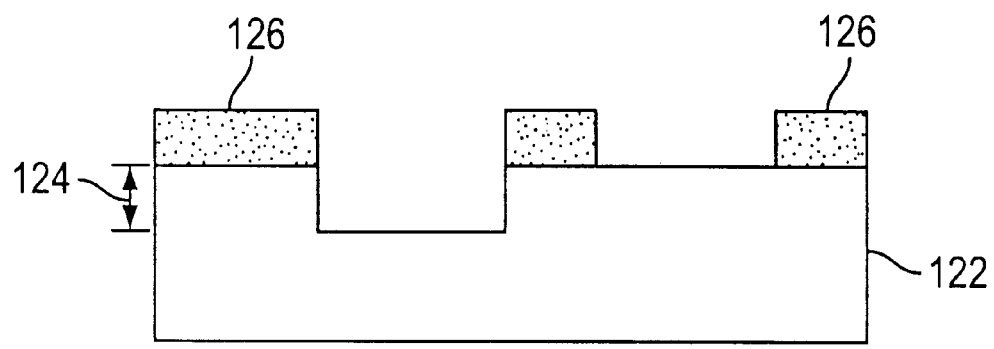
FIG. 19 is a cross-sectional view of a portion of a repaired phase shift photomask after a defect has been removed.

Mask 120 is then positioned in the FIB device and under FIB 128 utilizing the defect location data determined by the appearance tester when mask 120 was analyzed for defects. Once accurately positioned, FIB 128 is then activated according to the etching parameters and etch map 156 to correct and planarize phase shift defect 146. Because the relationship between the dose and etching rates are accurately understood, etch map 156 is accurately generated to provide for a precise dose for a specific height. Thus avoiding overetching and resulting in a repaired and accurate mask 120, shown in FIG. 19. In one embodiment, mask 120 is exposed to Halogen gas while FIB 128 is activated to repair mask 120 thus reducing the residual ionic implantation in phase shift layer 124 and substrate 122 which reduces or nullifies loss of transmission. The Halogen gas is selected such that the FIB 128 will react with the etching gas thus reducing staining effects of the beam. Further, residual staining is eliminated by cleaning mask 120 following the repairing of defects 146. The cleaning includes exposing the repaired area to a etchant capable of removing the FIB stains, for example hydrofluoric acids or heated alkali solutions as is known in the art.

Figure 20:
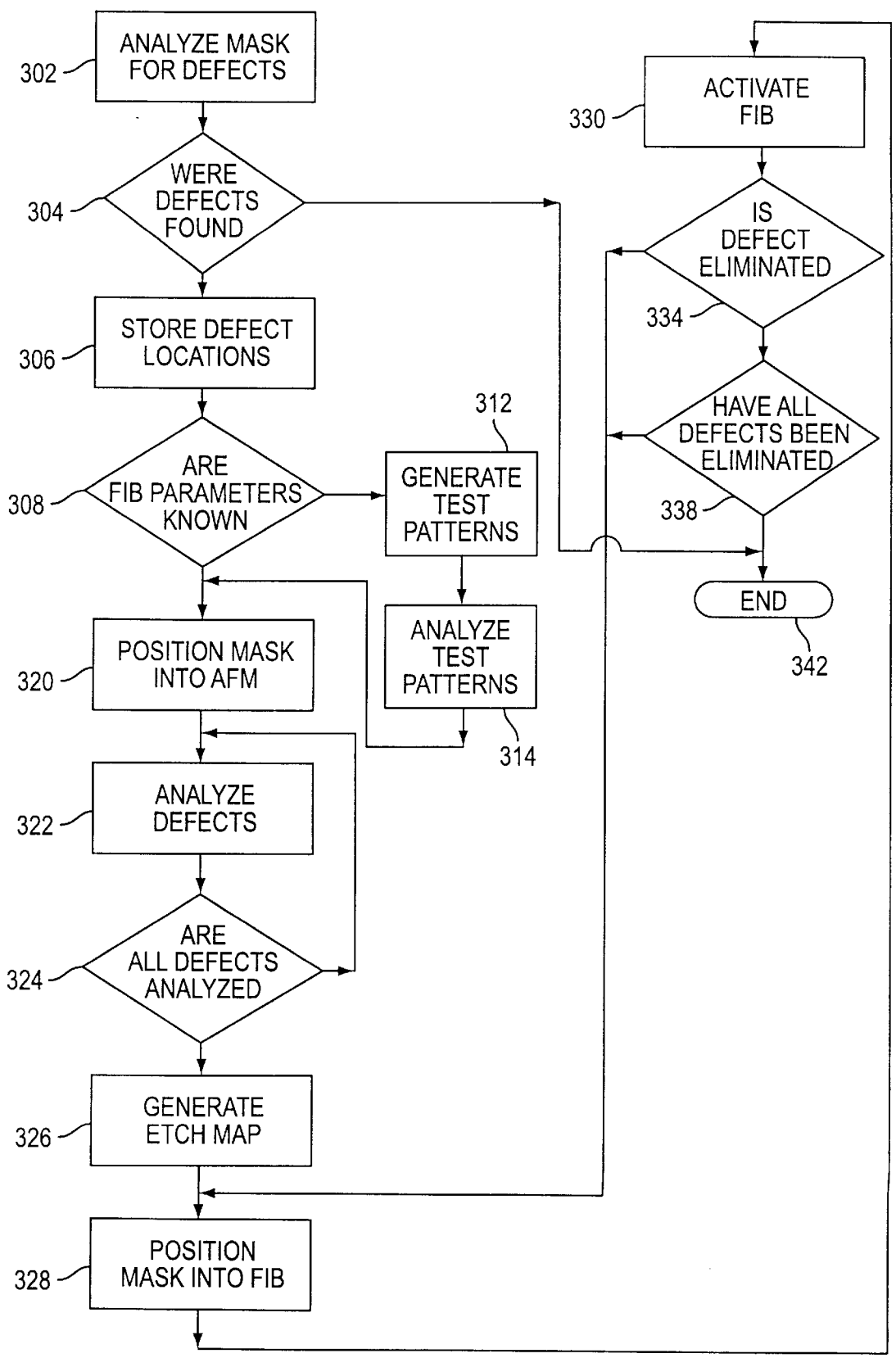
FIG. 20 is a flow chart representing one embodiment of the method of repairing a phase shift photomask.

FIG. 20 depicts a flow-chart of one embodiment of the method of correcting a Levenson quartz engraving phase shift photomask. In step 302 the etched mask 120 is analyzed for defects. Mask 120 is positioned in an appearance tester, wherein the appearance tester scans mask 120 for defects. The process then proceeds to condition 304 where it is determined whether defects were found in mask 120. If defects 146 are not found, then the process proceeds directly to step 342 where the process is terminated. If defects 146 are found, then step 306 is entered. In step 306 the defect location is determined and stored. In condition 308, it is determined if the FIB beam parameters, for the FIB device to be used to eliminate defect 146, are know. If the FIB beam parameters are known, then the process proceeds directly to step 320. If FIB beam parameters are not known, then steps 312 and 314 are preformed. In step 312, FIB 128 is directed onto a quartz test substrate material 160 which is the same material as that of phase shift layer 124 utilized in mask 120. The FIB device is activated for predetermined time to etch a predetermined test patterns 162 and 164. In step 314, test substrate material 160 is positioned into an AFM and is three-dimensionally analyzed. The three-dimensional information of test patterns 162 and 164 are stored and forwarded to the FIB device providing the FIB device with the FIB beam and etching parameters. The process then proceeds to step 320.

In step 320 mask 120 is positioned in the AFM. In step 322, the AFM is positioned over defect 146 and a three-dimensional analysis of defect 146 is performed. The results are then stored and forwarded to the FIB device. In condition 324 it is determined if all defects on mask 120 have been three-dimensionally analyzed by the AFM. If not, then the process returns to step 322 where AFM is positioned over a second defect for analysis. If yes the process proceeds to step 326. In step 326, an etch map 156 is generated for each defect 146 found based on the three-dimensional analysis results obtained in step 322 and the FIB beam parameters. In step 328 mask 120 is positioned in the FIB device. Mask 120 is then positioned utilizing the defect location previously determined such that FIB 128 will be directed onto defect 146. In step 330 the FIB device is activated according to the etch map 156 and beam parameters for a period of time as calculated according to the etch map 156. In condition 334, it is determined if the FIB device has completely eliminated the defects according to the location of the defect, the beam parameters, the etch map 156 and the thee-dimensional analysis results. If not, the process returns to step 328 where the mask is shifted and repositioned under the FIB according to the etch map 156. The process then returns to step 330 where the FIB is activated again according to the etch map 156. If, in condition 334, it is determined that the FIB device has eliminated the defect, the process moves to step 338 where the process determines if all defects found on mask 120 have been eliminated. If yes, then the process proceeds to step 342 where the process is terminated. If not, the process returns to step 328 where FIB is again positioned over a second defect 146 based on the defect location.

Figure 21:
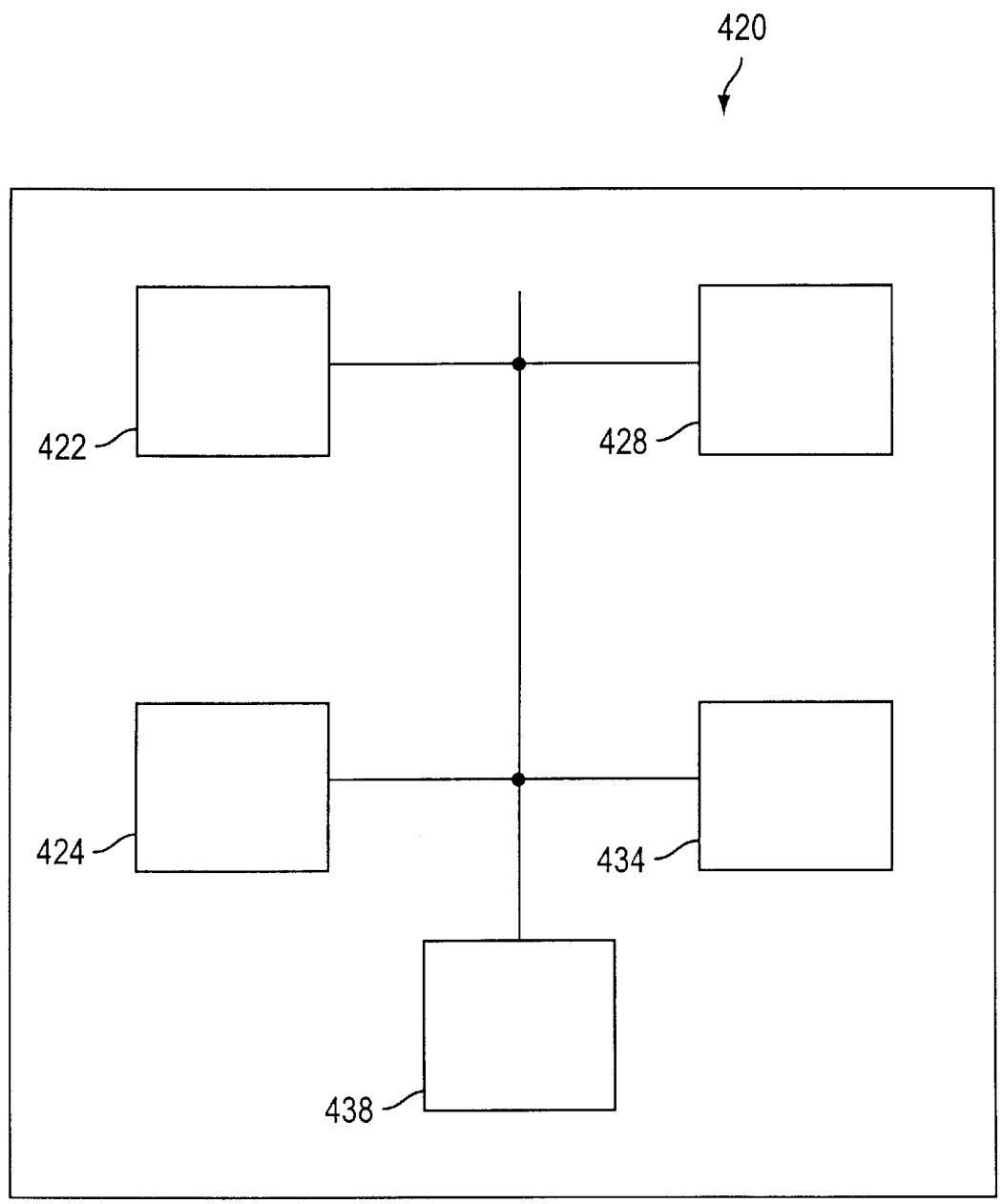
FIG. 21 depicts a schematic block diagram of the apparatus of the present invention utilized to repair alternating phase shift masks.

Referring to FIG. 21, in one embodiment of the invention a single phase shift correction apparatus 420 is utilized to perform the phase shift defect correction. Apparatus 420 includes an means for scanning or analyzing 422 the photomask 120 for defects. In one embodiment, means for scanning includes an appearance tester. Apparatus 420 stores the defect location information in an internal memory 424. Once mask 120 is fully scanned and all defect locations are acquired, apparatus 420 utilizes an internal means to three-dimensionally analyze 428 each defect and generates three-dimensional results characterizing each defect. In one embodiment means to three-dimensionally analyze 428 includes an AFM. The three-dimensional results are further stored in memory 424. Apparatus 420 includes a means for correcting or eliminating 434 phase shift defects, implemented to repair mask 120. In one embodiment, means for correcting 434 includes an FIB device to direct an FIB onto defect 146. Apparatus 420 further includes a processor means or microprocessor 438 coupled to means for scanning 422, means for three-dimensionally analyzing 428 and means for correcting 434. Processor means 438 also couples to memory 424 such that processor means 438 utilizes the three-dimensional results to generate an etch map 156 and to control each of the components of apparatus 420. In one embodiment, the processor means includes a computer.

While the present invention has been described with reference to a few specific embodiments, the description is illustrative of the invention and is not to be construed as liming the invention. Various modifications may occur to those skilled in the art without departing from the true spirit and scope of the invention as defined by the appended claims.

What is claimed is:

1. A method for repairing phase shift defects in a phase shift photomask, comprising:

locating at least one phase shift defect in the alternating phase shift mask analyzing the at least one phase shift defect in the phase shift photomask in three-dimensions producing three-dimensional results;

directing an actinic radiation beam onto the phase shift defect; and controlling the actinic radiation beam directed onto the phase shift defect based on the three-dimensional results obtained in the step of analyzing the phase shift defect.

2. The method for correcting defects in a phase shift photomask as claimed in claim 1, further comprising:

exposing the phase shift photomask to Halogen gas during the step of directing an actinic radiation beam and the step of controlling the actinic radiation beam.

3. The method for correcting defects in a phase shift photomask as claimed in claim 1, wherein:

the step of controlling the actinic radiation beam including controlling the actinic radiation beam based on actinic radiation beam parameters.

4. The method for correcting defects in a phase shift photomask as claimed in claim 3, wherein:

the step of controlling the actinic radiation beam based on the actinic radiation beam parameters including:

generating at least one actinic radiation beam test pattern;

three-dimensionally analyzing the test pattern producing three-dimensional test pattern results; and determining the actinic radiation beam parameters from the test pattern results.

5. The method for correcting defects in a phase shift photomask as claimed in claim 3, wherein:

the step of controlling the actinic radiation beam including generating an etch map.

6. A method for correcting defects in a phase shift photomask, comprising:

scanning the phase shift photomask for the defect;

determining a location of at least one phase shift defect;

three-dimensionally analyzing the defect producing three-dimensional results; and eliminating the defect, including:

directing a focus ion beam (FIB) onto the defect eliminating the defect.

7. The method of correcting a defect in the photomask as claimed in claim 6, wherein:

the step of directing the FIB onto the defect further including:

controlling the FIB according to the three-dimensional results obtained in the step of three-dimensionally analyzing the defect.

8. The method of correcting a defect in the photomask as claimed in claim 7, further comprising:

generating an etch map based on the three-dimensional results prior to the step of directing the FIB onto the defect.

9. The method of correcting a defect in the photomask as claimed in claim 8, wherein:

the step of generating an etch map including generating the etch map based on FIB parameters.

10. The method of correcting a defect in the photomask as claimed in claim 6, further comprising:

determining the FIB parameters prior to the step of directing actinic radiation onto the defect.

11. The method of correcting a defect in the photomask as claimed in claim 10, wherein:

the step of determining the FIB parameters including:

sputtering at least one test pattern; and measuring the test pattern.

12. The method of correcting a defect in the photomask as claimed in claim 11, wherein:

the step of measuring the test pattern including three-dimensionally measuring the test pattern.

13. The method of correcting a defect in the photomask as claimed in claim 12, wherein:

the step of measuring the test pattern including utilizing an atomic force microscope (AFM) to measure the test pattern.

14. The method of correcting a defect in the photomask as claimed in claim 12, wherein:

the step of measuring the test pattern including utilizing a profilometer to measure the test pattern.

15. The method of correcting a defect in the photomask as claimed in claim 6, wherein:

the step of three-dimensionally analyzing the defect including utilizing an AFM in performing the three-dimensional analysis.

16. The method of correcting a defect in the photomask as claimed in claim 6, wherein:

the step of three-dimensionally analyzing the defect including utilizing a profilometer in performing the three-dimensional analysis.

17. The method of correcting a defect in the photomask as claimed in claim 6, wherein:

the step of directing the FIB onto the defect including calculating an exposure duration and beam intensity.

18. The method of correcting a defect in the photomask as claimed in claim 6, further comprising:

repositioning the mask such that a second defect is positioned under the FIB; and directing the FIB onto the second defect eliminating the second defect.

19. An apparatus for repairing phase shift defects on an alternate phase shift photomask, comprising:

a means for analyzing the alternate phase shift photomask for defects coupled to a memory such that defect location on the mask is stored in memory;

a means for three-dimensionally analyzing the defect coupled to the memory to store three-dimensional results of three-dimensionally analyzing;

a processor means coupled to the memory, the means for analyzing, the means for three-dimensionally analyzing and a means for correcting the defect such that the processor controls the means for analyzing, the means for three-dimensionally analyzing and the means for correcting based on the defect location and the three-dimensional results; and the means for correcting the defect coupled to the processor to receive control instructions to eliminate the defect.

20. The apparatus for repairing phase shift defects as claimed in claim 19, further comprising:

a means for generating test patterns coupled to the processor such that the processor controls the means for generating test patterns.

21. The apparatus for repairing the phase shift defect as claimed in claim 20, further comprising:

a means for three-dimensionally analyzing the test pattern coupled to the means for processing such that the means for processing controls the means for three-dimensionally analyzing the test pattern; and the means for three-dimensionally analyzing the test patterns coupled to the memory to store the three-dimensional test pattern results.

* * * * *